(12) United States Patent
Feng et al.

(10) Patent No.: US 10,919,713 B2
(45) Date of Patent: Feb. 16, 2021

(54) SYSTEM FOR LOADING AND UNLOADING A SUBSTRATE, METHOD FOR LOADING A SUBSTRATE, AND METHOD FOR UNLOADING A SUBSTRATE

(71) Applicants: BOE Technology Group Co., Ltd., Beijing (CN); Chengdu BOE Optoelectronics Technology Co., Ltd., Chengdu (CN)

(72) Inventors: Jianlin Feng, Beijing (CN); Dawei Han, Beijing (CN); Jianjun Lin, Beijing (CN); Liang Zhou, Beijing (CN)

(73) Assignees: BOE Technology Group Co., Ltd., Beijing (CN); Chengdu BOE Optoelectronics Technology Co., Ltd., Chengdu (CN)

( * ) Notice: Subject to any disclaimer, the term of this patent is extended or adjusted under 35 U.S.C. 154(b) by 409 days.

(21) Appl. No.: 15/772,716

(22) PCT Filed: Oct. 10, 2017

(86) PCT No.: PCT/CN2017/105563
§ 371 (c)(1),
(2) Date: May 1, 2018

(87) PCT Pub. No.: WO2018/171169
PCT Pub. Date: Sep. 27, 2018

(65) Prior Publication Data
US 2019/0241376 A1 Aug. 8, 2019

(30) Foreign Application Priority Data
Mar. 23, 2017 (CN) .......................... 2017 1 0177740

(51) Int. Cl.
*H01L 21/677* (2006.01)
*B65G 49/06* (2006.01)
*H01L 21/00* (2006.01)

(52) U.S. Cl.
CPC ......... *B65G 49/061* (2013.01); *B65G 49/067* (2013.01); *B65G 49/068* (2013.01); *H01L 21/00* (2013.01); *B65G 2249/04* (2013.01)

(58) Field of Classification Search
CPC ................................................ H01L 21/67754
See application file for complete search history.

(56) References Cited

U.S. PATENT DOCUMENTS 5,558,482 A    9/1996  Hiroki et al.
5,989,346 A *  11/1999 Hiroki .................. C23C 14/566
                                                    118/719

(Continued)

FOREIGN PATENT DOCUMENTS

CN    101211812 A    7/2008
CN    101318328 A    12/2008

(Continued)

OTHER PUBLICATIONS

Chinese Office Action issued for Application No. 2017101777406, dated Jul. 25, 2018.

(Continued)

*Primary Examiner* — Jonathan Snelting
(74) *Attorney, Agent, or Firm* — Arent Fox LLP; Michael Fainberg

(57) ABSTRACT

The disclosed system for loading and unloading the substrate includes: a substrate rotation apparatus having a first rotation position and a second rotation position with a difference in rotation angle of 90 degrees, wherein the substrate rotation apparatus includes two layers of sucker assemblies, each of which includes a plate body, a plurality (Continued)

of support suction tubes arranged on the plate body, and first suckers connected with tops of respective support suction tubes respectively, and there are gaps, for inserting the substrate therein, between respective first suckers of a lower layer of sucker assembly, and a plate body of an upper layer of sucker assembly; and a mechanical hand including a plurality of mechanical fingers capable of holding two halves of the substrate, both of which are arranged in a length direction of the mechanical fingers, and joined together into an entire substrate.

6 Claims, 5 Drawing Sheets

(56) References Cited

U.S. PATENT DOCUMENTS

| | | | |
|---|---|---|---|
| 7,878,213 B2* | 2/2011 | Mitsuyoshi | H01L 21/67745 134/133 |
| 8,757,180 B2* | 6/2014 | Mitsuyoshi | H01L 21/67766 134/151 |
| 2006/0045722 A1* | 3/2006 | Hashimoto | H01L 21/68707 414/754 |
| 2008/0156357 A1 | 7/2008 | Mitsuyoshi | |

FOREIGN PATENT DOCUMENTS

| | | |
|---|---|---|
| CN | 102129963 A | 7/2011 |
| CN | 102495492 A | 6/2012 |
| CN | 102642714 A | 8/2012 |
| CN | 103342205 A | 10/2013 |
| JP | H04192346 A | 7/1992 |
| JP | H11130255 A | 5/1999 |

OTHER PUBLICATIONS

Chinese Office Action issued for Application No. 2017101777406, dated Jan. 9, 2019.

* cited by examiner

US 10,919,713 B2

SYSTEM FOR LOADING AND UNLOADING A SUBSTRATE, METHOD FOR LOADING A SUBSTRATE, AND METHOD FOR UNLOADING A SUBSTRATE

This application is a National Stage of International Application No. PCT/CN2017/105563, filed Oct. 10, 2017, which claims priority to Chinese Patent Application No. 201710177740.6, filed Mar. 23, 2017, both of which are hereby incorporated by reference in their entireties.

FIELD

This disclosure relates to the field of fabricating a display device, and particularly to a system for loading and unloading a substrate, a method for loading a substrate, and a method for unloading a substrate.

BACKGROUND

As the sciences and technologies are advancing constantly, a Thin Film Transistor Liquid Crystal Display (TFT-LCD) device and an Organic Light-Emitting Diode (OLED) display device have been widely applied in people's daily living and working.

The inventors of the disclosure have identified that in a process of fabricating a substrate of an existing display device, some process devices are applicable to an entire substrate, and some process devices are only applicable to half of the substrate, so it is highly desirable at present to address the technical problem of how to make reasonable use of the existing process devices so as to improve the production capacity of the substrate.

In order to fabricate an OLED touch substrate in a 6-th generation of production line, for example, a vapor deposition device can deposit at largest a half of a substrate; and related devices designed especially for half of the substrate have to be used in subsequent encapsulation, touch screen fabrication, and other processes, thus resulting in both a high cost and a low production capacity of the display device.

SUMMARY

An embodiment of the disclosure provides a system for loading and unloading a substrate, the system including: a substrate rotation apparatus having a first rotation position and a second rotation position with a difference in rotation angle of 90 degrees, wherein the substrate rotation apparatus includes two layers of sucker assemblies, each of which includes a plate body, a plurality of support suction tubes arranged on the plate body, and first suckers connected with tops of respective support suction tubes respectively, and there are gaps, for inserting the substrate therein, between respective first suckers of a lower layer of sucker assembly, and a plate body of an upper layer of sucker assembly; and a mechanical hand including a plurality of mechanical fingers capable of holding two halves of the substrate, both of which are arranged in a length direction of the mechanical fingers, and joined together into an entire substrate.

Optionally the plate body of the upper layer of sucker assembly includes evasion notches for the plurality of mechanical fingers to pass therethrough. With the structure of the evasion notches, there is a shorter stroke of the mechanical hand to thereby improve the efficiency of conveying the half of the substrate so as to improve the efficiency of fabricating the substrate.

Optionally the plate body of the upper layer of sucker assembly, and a plate body of the lower layer of sucker assembly are spaced apart from each other through a plurality of support posts.

Optionally the plurality of support suction tubes of each sucker assembly are arranged in an array.

Optionally there is an adjustable spacing between two adjacent mechanical fingers of the mechanical hand. With this design, a segment of the substrate between the adjacent mechanical fingers can be alleviated from being depressed downward due to the gravity thereof.

Optionally there are a plurality of second suckers, configured to absorb the substrate, on a side of each mechanical finger on which the substrate is carried. The mechanical fingers with the second suckers can absorb the substrate placed on the mechanical fingers to thereby avoid the substrate from falling off while being conveyed.

Optionally the plurality of second suckers are divided into at least two groups in the length direction of the mechanical fingers, and the at least two groups of second suckers can be controlled respectively to be in an adsorption state.

Optionally the system for loading and unloading the substrate further includes: a drive apparatus configured to drive the substrate rotation apparatus to be switched between the first rotation position and the second rotation position; and a vacuum extraction device configured to be connected with respective support suction tubes of the two layers of sucker assemblies.

An embodiment of the disclosure provides a method for loading a substrate, the method including: controlling a mechanical hand to take two halves of the substrate sequentially out of a substrate storage chuck, and placing the two halves of the substrate respectively on two layers of sucker assemblies of a substrate rotation apparatus at a first rotation position; controlling the substrate rotation apparatus to be switched to a second rotation position; controlling the mechanical hand to take the two halves of the substrate sequentially out of a lower layer of sucker assembly and an upper layer of sucker assembly of the substrate rotation apparatus at the second rotation position, so that the two halves of the substrate are arranged in a length direction of mechanical fingers, and joined together into an entire substrate, on the mechanical fingers; and controlling the mechanical hand to convey the two halves of the substrate joined together into the entire substrate to a substrate machining device.

Optionally controlling the mechanical hand to take the two halves of the substrate sequentially out of the lower layer of sucker assembly and the upper layer of sucker assembly of the substrate rotation apparatus at the second rotation position includes: when a plate body of the upper layer of sucker assembly of the substrate rotation apparatus includes evasion notches for the mechanical fingers to pass therethrough, controlling the mechanical hand to take one half of the substrate out of the lower layer of sucker assembly of the substrate rotation apparatus at the second rotation position; controlling the mechanical hand to ascend to the upper layer of sucker assembly through the evasion notches; and controlling the mechanical hand to take the other half of the substrate out of the upper layer of sucker assembly of the substrate rotation apparatus at the second rotation position; wherein an insertion displacement of S1 of the mechanical fingers of the mechanical hand when taking one half of the substrate out of the lower layer of sucker assembly, and an insertion displacement of S2 of the mechanical fingers of the mechanical hand when taking the other half of the substrate out of the upper layer of sucker assembly satisfy that: S1−S2=a size of a half of the substrate in the length direction of the mechanical fingers. When the plate body of the upper layer of sucker assembly of the substrate rotation apparatus includes the evasion notches, the mechanical hand can ascend to the upper layer of sucker assembly from the lower layer of sucker assembly through the evasion notches to thereby shorten a stroke over which the mechanical hand is retracted, so as to improve the efficiency of conveying the half of the substrate, and the efficiency of fabricating the substrate.

Optionally before controlling the mechanical hand to take the two halves of the substrate sequentially out of the lower layer of sucker assembly and the upper layer of sucker assembly of the substrate rotation apparatus at the second rotation position, the method further includes: adjusting spacing between two adjacent mechanical fingers of the mechanical hand from a first preset spacing to a second preset spacing. With this design, the segment of the substrate between the adjacent mechanical fingers can be alleviated from being depressed downward due to the gravity thereof.

An embodiment of the disclosure provides a method for unloading a substrate, the method including: controlling a mechanical hand to take two halves of the substrate joined together into an entire substrate out of a substrate machining device, and placing the two halves of the substrate respectively on two layers of sucker assemblies of a substrate rotation apparatus at a second rotation position; controlling the substrate rotation apparatus to be switched to a first rotation position; and controlling the mechanical hand to take the two halves of the substrate sequentially out of the two layers of sucker assemblies of the substrate rotation apparatus at the first rotation position, and conveying the two halves of the substrate respectively into a substrate storage chuck.

Optionally controlling the mechanical hand to take the two halves of the substrate joined together into the entire substrate out of the substrate machining device, and placing the two halves of the substrate respectively on the two layers of sucker assemblies of the substrate rotation apparatus at the second rotation position includes: when a plate body of an upper layer of sucker assembly of the substrate rotation apparatus includes evasion notches for mechanical fingers to pass therethrough, controlling the mechanical hand to take the two halves of the substrate joined together into the entire substrate out of the substrate machining device; controlling the mechanical hand to place one half of the substrate on the upper layer of sucker assembly of the substrate rotation apparatus at the second rotation position; controlling the mechanical hand to descend to a lower layer of sucker assembly through the evasion notches; and controlling the mechanical hand to place the other half of the substrate on the lower layer of sucker assembly of the substrate rotation apparatus at the second rotation position. When the plate body of the upper layer of sucker assembly of the substrate rotation apparatus includes the evasion notches, the mechanical hand can descend to the lower layer of sucker assembly from the upper layer of sucker assembly through the evasion notches to thereby shorten a stroke over which the mechanical hand is retracted, so as to improve the efficiency of conveying the half of the substrate, and the efficiency of fabricating the substrate.

Optionally before controlling the mechanical hand to take the two halves of the substrate sequentially out of the two layers of sucker assemblies of the substrate rotation apparatus at the first rotation position, the method further includes: adjusting spacing between two adjacent mechanical fingers of the mechanical hand from a second preset spacing to a first preset spacing. With this design, the segment of the substrate between the adjacent mechanical fingers can be alleviated from being depressed downward due to the gravity thereof.

DETAILED DESCRIPTION OF THE EMBODIMENTS

Figure 1:
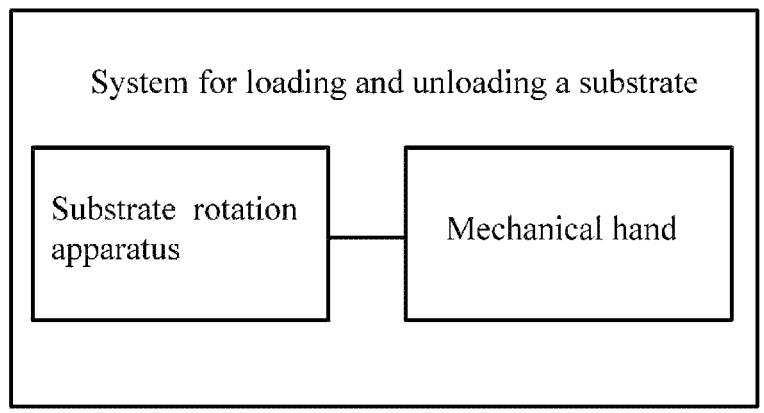
FIG. 1 is a schematic diagram of a system for loading and unloading a substrate according to embodiments of the disclosure.

In order to improve the production capacity of a substrate, embodiments of the disclosure provide a system for loading and unloading a substrate, a method for loading a substrate, and a method for unloading a substrate. In order to make the objects, technical solutions, and advantages of the disclosure more apparent, the disclosure will be described below in further details in connection with the embodiments thereof.

As illustrated in FIG. 1 to FIG. 3 and FIG. 5, embodiments of the disclosure provide a system for loading and unloading a substrate, where the system includes: a substrate rotation apparatus 1 having a first rotation position and a second rotation position with a difference in rotation angle of 90 degrees, where the substrate rotation apparatus includes two layers of sucker assemblies, each of which includes a plate body, a plurality of support suction tubes 15 arranged on the plate body, and first suckers 16 connected with tops of respective support suction tubes respectively, and there are gaps, for inserting the substrate therein, between respective first suckers 16 of a lower layer of sucker assembly 12, and a plate body of an upper layer of sucker assembly 11; and a mechanical hand 2 including mechanical fingers 21 capable of holding two halves 3 of the substrate, both of which are arranged in a length direction of the mechanical fingers 21, and joined together into an entire substrate.

In the system for loading and unloading the substrate according to the embodiments of the disclosure, the substrate is loaded in such a way that the mechanical hand takes the two halves of the substrate out of the two layers of sucker assemblies of the substrate rotation apparatus, so that the two halves of the substrate are arranged in the length direction of the mechanical fingers, and joined together into the entire substrate, on the mechanical fingers; and the substrate is unloaded in such a way that the mechanical hand places the two finished halves of the substrate on the two layers of sucker assemblies of the substrate rotation apparatus, so that the two halves of the substrate joined together into the entire substrate are separated. With the system for loading and unloading the substrate, the two halves of the substrate can be joined together during the operation of loading the substrate, and the two halves of the substrate can be fabricated concurrently using the existing process devices to thereby improve the production capacity of the substrate.

As illustrated in FIG. 1 to FIG. 3 and FIG. 5, in an optional embodiment of the disclosure, the plate body of the upper layer of sucker assembly 11 in the substrate rotation apparatus 1 includes evasion notches 14 for the mechanical fingers 21 to pass therethrough. The substrate is loaded in such a way that the mechanical hand 2 can take the two halves 3 of the substrate out of the two layers of sucker assemblies of the substrate rotation apparatus 1 at the second rotation position by firstly taking one half 3 of the substrate out of the lower layer of sucker assembly 12, then ascending to the upper layer of sucker assembly 11 through the evasion notches 14, and next taking the other half 3 of the substrate out of the upper layer of sucker assembly 11. And the substrate is unloaded in such a way that the mechanical hand 2 can place the two halves 3 of the substrate joined together into the entire substrate respectively on the two layers of sucker assemblies of the substrate rotation apparatus 1 at the second rotation position by firstly placing one half 3 of the substrate on the upper layer of sucker assembly 11 of the substrate rotation apparatus 1 at the second rotation position, then descending to the lower layer of sucker assembly 12 through the evasion notches 14, and next placing the other half 3 of the substrate on the lower layer of sucker assembly 12. In this embodiment, the mechanical hand 2 can take and place the substrate respectively over a shorter stroke due to the evasion notches 14 structured in the system for loading and unloading the substrate to thereby improve the efficiency of conveying the half of the substrate, and the efficiency of fabricating the substrate.

Figure 2:
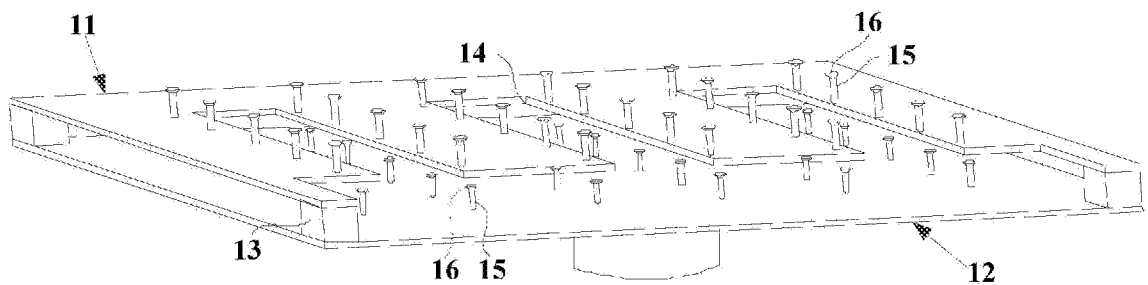
FIG. 2 is a schematic diagram of a substrate rotation apparatus according to the embodiments of the disclosure.

In the system for loading and unloading the substrate according to the embodiments of the disclosure, the upper layer of sucker assembly, and the lower layer of sucker assembly of the substrate rotation apparatus can be spaced apart from each other through a connection component. As illustrated in FIG. 2, in an optional embodiment of the disclosure, the connection component includes a plurality of support posts 13 connecting the upper layer of sucker assembly 11 with the lower layer of sucker assembly 12, so that there are the gaps, for inserting the substrate therein, between the respective first suckers 16 of the lower layer of sucker assembly 12, and the plate body of the upper layer of sucker assembly 11.

Further referring to FIG. 2, the plurality of support suction tubes 15 of each sucker assembly in the substrate rotation apparatus 1 will not be limited to any particular distribution pattern, and for example, they can be arranged in an annular pattern or a rectangular array. In the embodiments of the disclosure, the plurality of support suction tubes 15 of the two sucker assemblies are arranged in the rectangular array.

In an optional embodiment of the disclosure, there is an adjustable spacing between two adjacent mechanical fingers of the mechanical hand. In this embodiment, before the mechanical hand takes out of the substrate, the spacing between two adjacent mechanical fingers of the mechanical hand can be adjusted according to the size of the substrate, so that the mechanical hand can carry the substrate with a varying size, thus improving the stability of holding the substrate in the mechanical hand.

Optionally there are a plurality of second suckers for absorbing the substrate, on a side of each mechanical finger on which the substrate is carried. The mechanical fingers with the second suckers can absorb the substrate placed on the mechanical fingers to thereby avoid the substrate from falling off while being conveyed.

Figure 3:
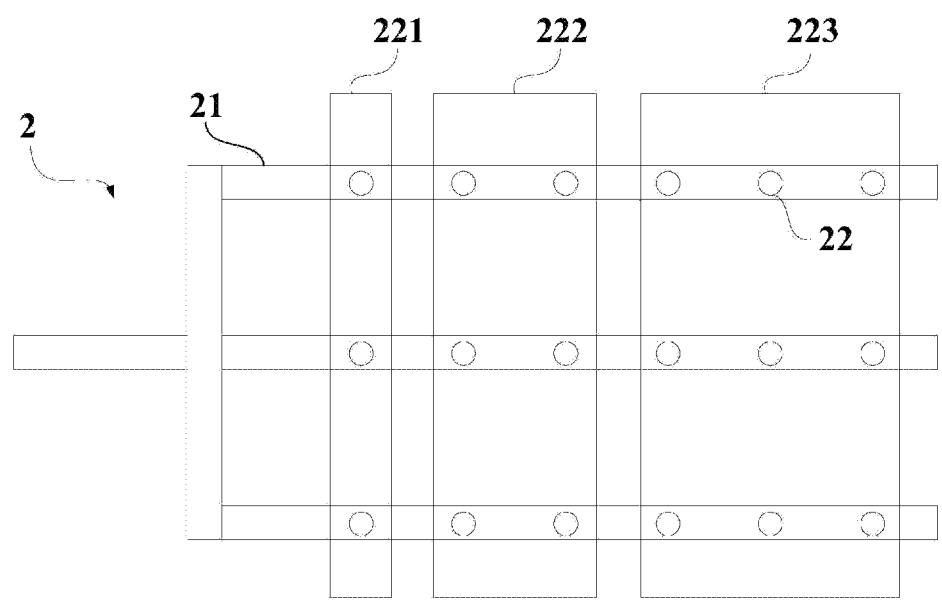
FIG. 3 is a schematic diagram of a mechanical hand according to the embodiments of the disclosure.

The plurality of second suckers above are divided into at least two groups in the length direction of the mechanical fingers, and the at least two groups of second suckers can be controlled respectively to be in an absorption state. As illustrated in FIG. 3, in an optional embodiment of the disclosure, the plurality of second suckers 22 are divided into a first group of suckers 221, a second group of suckers 222, and a third group of suckers 223 in the length direction of the mechanical fingers 21, and these three groups of suckers can be controlled respectively to be in an absorption state.

In an optional embodiment of the disclosure, the system for loading and unloading the substrate further includes: a drive apparatus configured to drive the substrate rotation apparatus to be switched between the first rotation position and the second rotation position; and a vacuum extraction device configured to be connected with respective support suction tubes of the two layers of sucker assemblies. In this embodiment, the drive apparatus will not be limited to any particular type, and for example, can be a stepper motor or a servo motor.

Figure 4:
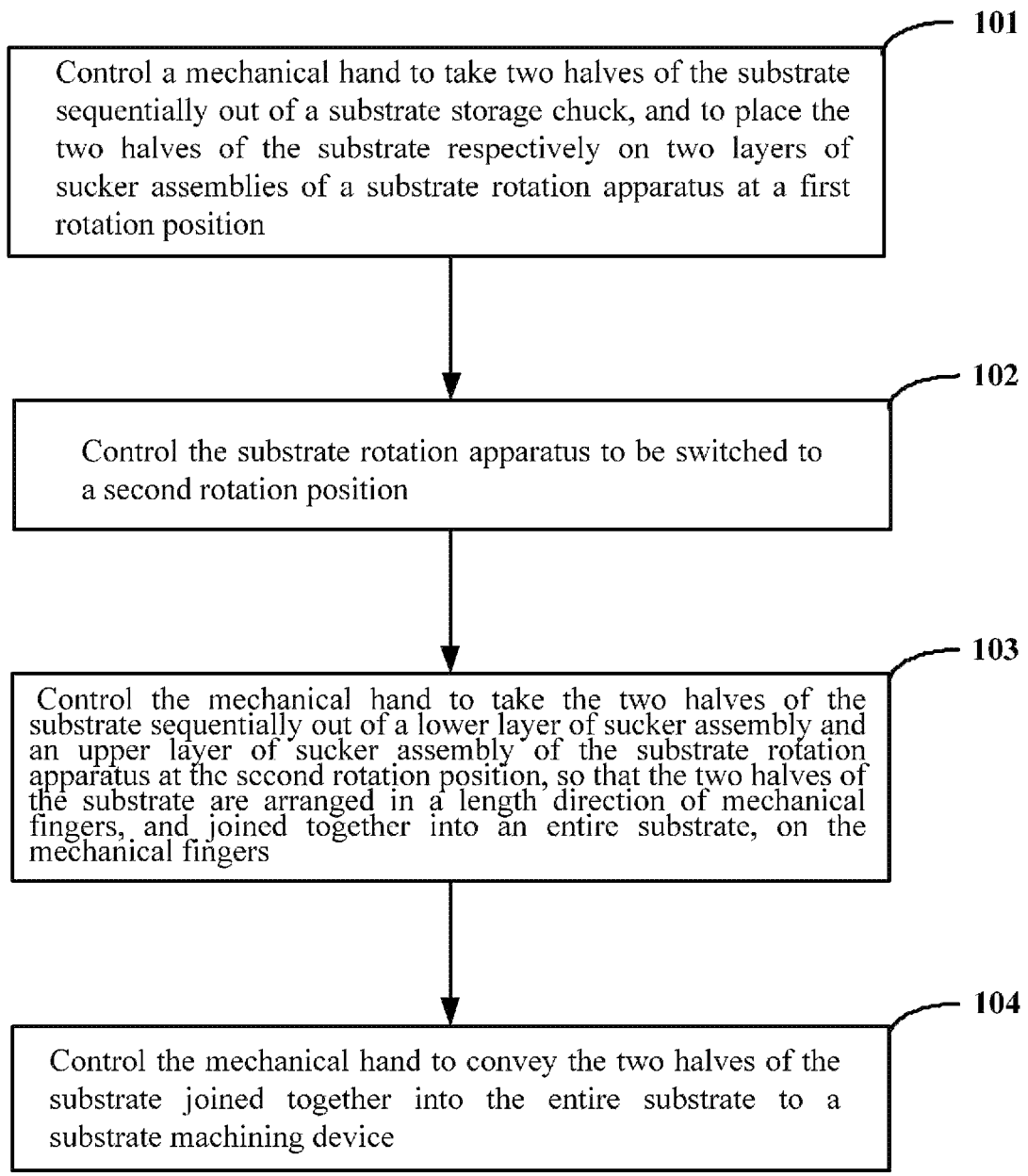
FIG. 4 is a schematic flow chart of a method for loading a substrate according to the embodiments of the disclosure.

As illustrated in FIG. 4, the embodiments of the disclosure provide a method for loading a substrate, where the method includes the following operations.

The operation 101 is to control a mechanical hand to take two halves of the substrate sequentially out of a substrate storage chuck, and to place the two halves of the substrate respectively on two layers of sucker assemblies of a substrate rotation apparatus at a first rotation position.

The operation 102 is to control the substrate rotation apparatus to be switched to a second rotation position.

The operation 103 is to control the mechanical hand to take the two halves of the substrate sequentially out of a lower layer of sucker assembly and an upper layer of sucker assembly of the substrate rotation apparatus at the second rotation position, so that the two halves of the substrate are arranged in a length direction of mechanical fingers, and joined together into an entire substrate, on the mechanical fingers.

The operation 104 is to control the mechanical hand to convey the two halves of the substrate joined together into the entire substrate to a substrate machining device.

In the method for loading the substrate according to the embodiments, while the mechanical hand is being controlled to take the two halves of the substrate sequentially out of the two layers of sucker assemblies of the substrate rotation apparatus at the second rotation position, the two halves of the substrate are arranged in the length direction of the mechanical fingers, and joined together into the entire substrate, on the mechanical fingers, so that the two halves of the substrate joined together into the entire substrate can be processed concurrently by the substrate machining device; and as compared with the prior art, the halves of the substrate can be processed in the method for loading the substrate using the exiting process device for processing the entire substrate to thereby improve the production capacity of the substrate.

In an optional embodiment of the disclosure, when a plate body of the upper layer of sucker assembly of the substrate rotation apparatus includes evasion notches for the mechanical fingers to pass therethrough, controlling the mechanical hand to take the two halves of the substrate sequentially out of the lower layer of sucker assembly and the upper layer of sucker assembly of the substrate rotation apparatus at the second rotation position in the operation 103 includes the following operations.

Figure 5A:
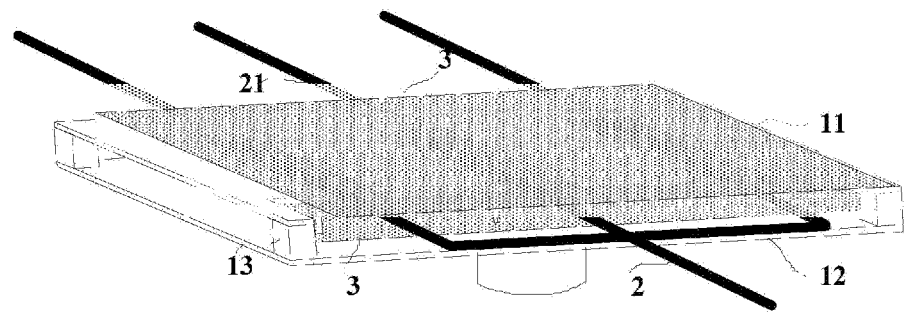
FIG. 5A is a schematic diagram after an operation 201 in the method for loading the substrate according to the embodiments of the disclosure is completed.

The operation 201 is to control the mechanical hand to take one half of the substrate out of the lower layer of sucker assembly of the substrate rotation apparatus at the second rotation position as illustrated in FIG. 5A, where an insertion displacement of the mechanical fingers of the mechanical hand when taking one half of the substrate out of the lower layer of sucker assembly is S1.

Figure 5B:
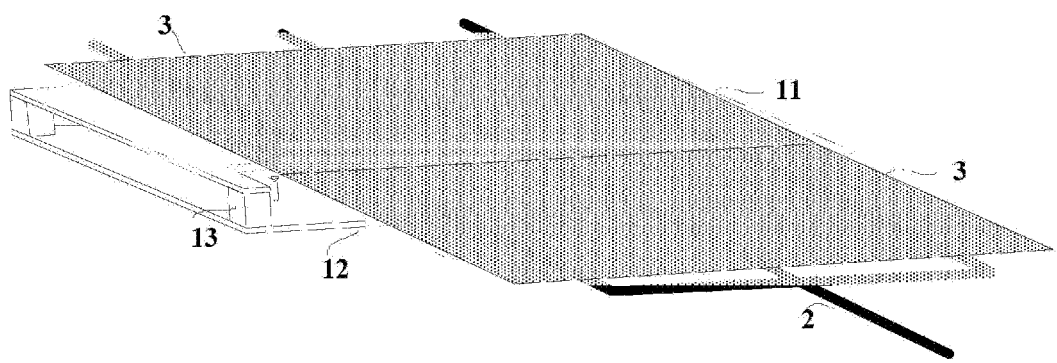
FIG. 5B is a schematic diagram after an operation 202 in the method for loading the substrate according to the embodiments of the disclosure is completed.

The operation 202 is to control the mechanical hand to ascend to the upper layer of sucker assembly through the evasion notches as illustrated in FIG. 5B.

Figure 5C:
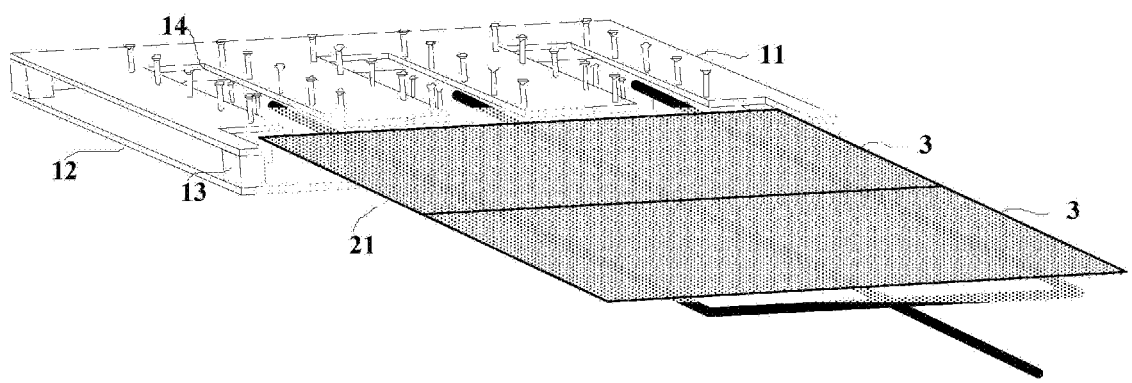
FIG. 5C is a schematic diagram after an operation 203 in the method for loading the substrate according to the embodiments of the disclosure is completed.

The operation 203 is to control the mechanical hand to take the other half of the substrate out of the upper layer of sucker assembly of the substrate rotation apparatus at the second rotation position as illustrated in FIG. 5C, where an insertion displacement of the mechanical fingers of the mechanical hand when taking the other half of the substrate out of the upper layer of sucker assembly is S2.

In the operations above, the insertion displacement of S1 of the mechanical fingers of the mechanical hand when taking one half of the substrate out of the lower layer of sucker assembly, and the insertion displacement of S2 of the mechanical fingers of the mechanical hand when taking the other half of the substrate out of the upper layer of sucker assembly satisfy that: S1−S2=a size of a half of the substrate in the length direction of the mechanical fingers.

In the embodiments, when the plate body of the upper layer of sucker assembly of the substrate rotation apparatus includes the evasion notches, the mechanical hand can ascend to the upper layer of sucker assembly from the lower layer of sucker assembly through the evasion notches to thereby shorten a stroke over which the mechanical hand is retracted, so as to improve the efficiency of conveying the half of the substrate, and the efficiency of fabricating the substrate.

In an optional embodiment of the disclosure, spacing between two adjacent mechanical fingers of the mechanical hand is adjusted from a first preset spacing to a second preset spacing before the operation 103. With this design, the segment of the substrate between the adjacent mechanical fingers can be alleviated from being depressed downward due to the gravity thereof.

In the embodiments of the disclosure, at least one group of second suckers on the mechanical fingers can be controlled respectively to be in an absorption state, according to the number of substrates to be conveyed by the mechanical hand. As illustrated in FIG. 3, in an optional embodiment of the disclosure, the plurality of second suckers 22 are divided into a first group of suckers 221, a second group of suckers 222, and a third group of suckers 223 in the length direction of the mechanical fingers 21. When the mechanical hand 2 conveys the two halves of the substrate joined together into the entire substrate, the first group of suckers 221 and the second group of suckers 222 absorb one half of the substrate on the mechanical fingers 21 away from the terminals of the mechanical fingers 21, and the third group of suckers 223 absorb the other half of the substrate on the mechanical fingers 21 proximate to the terminals of the mechanical fingers 21; and when the mechanical hand 2 conveys one half of the substrate, the second group of suckers 222, and the third group of suckers 223 absorb the half of the substrate on the mechanical fingers 21.

Figure 6:
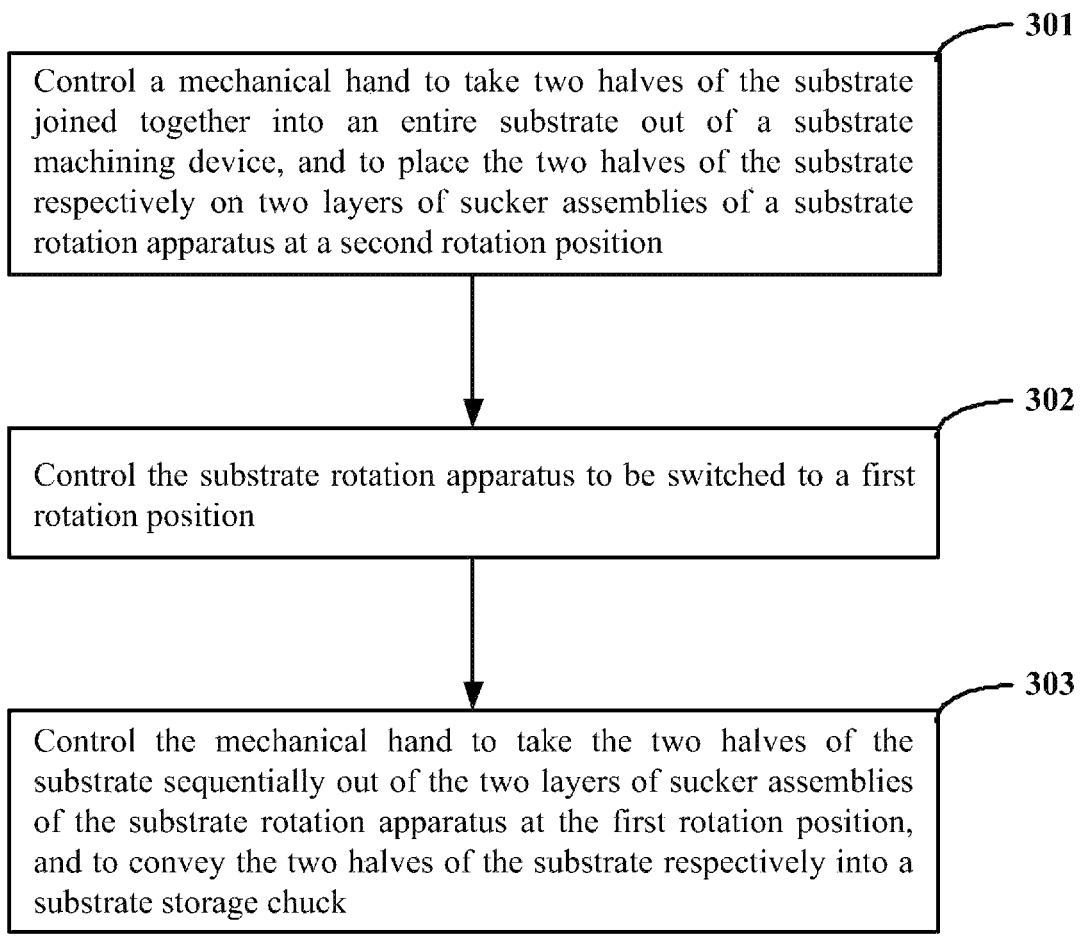
FIG. 6 is a schematic flow chart of a method for unloading a substrate according to the embodiments of the disclosure.

As illustrated in FIG. 6, the embodiments of the disclosure further provide a method for unloading a substrate, where the method includes the following operations.

The operation 301 is to control a mechanical hand to take two halves of the substrate joined together into an entire substrate out of a substrate machining device, and to place the two halves of the substrate respectively on two layers of sucker assemblies of a substrate rotation apparatus at a second rotation position.

The operation 302 is to control the substrate rotation apparatus to be switched to a first rotation position.

The operation 303 is to control the mechanical hand to take the two halves of the substrate sequentially out of the two layers of sucker assemblies of the substrate rotation apparatus at the first rotation position, and to convey the two halves of the substrate respectively into a substrate storage chuck.

In the method for unloading the substrate according to the embodiments, the mechanical hand is controlled to take the two halves of the substrate joined together into the entire substrate out of the substrate machining device, and to place them sequentially on the two layers of sucker assemblies of the substrate rotation apparatus, and this process separates the two halves of the substrate joined together into the entire substrate, thus improving the efficiency of conveying the half of the substrate, and the production capacity of the substrate, in the method for unloading the substrate as compared with the prior art.

In an optional embodiment of the disclosure, when a plate body of an upper layer of sucker assembly of the substrate rotation apparatus includes evasion notches for mechanical fingers to pass therethrough, the operation 301 includes the following operations.

The operation 401 is to control the mechanical hand to take the two halves of the substrate joined together into the entire substrate out of the substrate machining device.

The operation 402 is to control the mechanical hand to place one half of the substrate on the upper layer of sucker assembly of the substrate rotation apparatus at the second rotation position.

The operation 403 is to control the mechanical hand to descend to a lower layer of sucker assembly through the evasion notches.

The operation 404 is to control the mechanical hand to place the other half of the substrate on the lower layer of sucker assembly of the substrate rotation apparatus at the second rotation position.

When the plate body of the upper layer of sucker assembly of the substrate rotation apparatus includes the evasion notches, the mechanical hand can descend to the lower layer of sucker assembly from the upper layer of sucker assembly through the evasion notches to thereby shorten a stroke over which the mechanical hand is retracted, so as to improve the efficiency of conveying the half of the substrate, and the efficiency of fabricating the substrate.

In an optional embodiment of the disclosure, spacing between two adjacent mechanical fingers of the mechanical hand is adjusted from a second preset spacing to a first preset spacing before the operation 303. With this design, the segment of the substrate between the adjacent mechanical fingers can be alleviated from being depressed downward due to the gravity thereof.

In the embodiments of the disclosure, at least one group of second suckers on the mechanical fingers can be controlled respectively to be in an absorption state, according to the number of substrates to be conveyed by the mechanical hand. As illustrated in FIG. 3, in an optional embodiment of the disclosure, the plurality of second suckers 22 are divided into a first group of suckers 221, a second group of suckers 222, and a third group of suckers 223 in a length direction of the mechanical fingers 21. When the mechanical hand 2 conveys the two halves of the substrate joined together into the entire substrate, the first group of suckers 221 and the second group of suckers 222 absorb one half of the substrate on the mechanical fingers 21 away from the terminals of the mechanical fingers 21, and the third group of suckers 223 absorb the other half of the substrate on the mechanical fingers 21 proximate to the terminals of the mechanical fingers 21; and when the mechanical hand 2 conveys one half of the substrate, the second group of suckers 222, and the third group of suckers 223 absorb the half of the substrate on the mechanical fingers 21.

Evidently those skilled in the art can make various modifications and variations to the disclosure without departing from the spirit and scope of the disclosure. Thus the disclosure is also intended to encompass these modifications and variations thereto so long as the modifications and variations come into the scope of the claims appended to the disclosure and their equivalents.

The invention claimed is:

1. A method for loading a substrate, the method comprising:
    controlling a mechanical hand to take two halves of the substrate sequentially out of a substrate storage chuck, and placing the two halves of the substrate respectively on two layers of sucker assemblies of a substrate rotation apparatus at a first rotation position;
    controlling the substrate rotation apparatus to be switched to a second rotation position;
    controlling the mechanical hand to take the two halves of the substrate sequentially out of a lower layer of sucker assembly and an upper layer of sucker assembly of the substrate rotation apparatus at the second rotation position, so that the two halves of the substrate are arranged in a length direction of mechanical fingers, and joined together into an entire substrate, on the mechanical fingers; and
    controlling the mechanical hand to convey the two halves of the substrate joined together into the entire substrate to a substrate machining device.

2. The method for loading the substrate according to claim 1, wherein controlling the mechanical hand to take the two halves of the substrate sequentially out of the lower layer of sucker assembly and the upper layer of sucker assembly of the substrate rotation apparatus at the second rotation position comprises:
    when a plate body of the upper layer of sucker assembly of the substrate rotation apparatus comprises evasion notches for the mechanical fingers to pass therethrough, controlling the mechanical hand to take one half of the substrate out of the lower layer of sucker assembly of the substrate rotation apparatus at the second rotation position;
    controlling the mechanical hand to ascend to the upper layer of sucker assembly through the evasion notches; and
    controlling the mechanical hand to take the other half of the substrate out of the upper layer of sucker assembly of the substrate rotation apparatus at the second rotation position;
    wherein an insertion displacement of S1 of the mechanical fingers of the mechanical hand when taking one half of the substrate out of the lower layer of sucker assembly, and an insertion displacement of S2 of the mechanical fingers of the mechanical hand when taking the other half of the substrate out of the upper layer of sucker assembly satisfy that: S1−S2=a size of a half of the substrate in the length direction of the mechanical fingers.

3. The method for loading the substrate according to claim 1, wherein before controlling the mechanical hand to take the two halves of the substrate sequentially out of the lower layer of sucker assembly and the upper layer of sucker assembly of the substrate rotation apparatus at the second rotation position, the method further comprises:
    adjusting spacing between two adjacent mechanical fingers of the mechanical hand from a first preset spacing to a second preset spacing.

4. A method for unloading a substrate, the method comprising:
    controlling a mechanical hand to take two halves of the substrate joined together into an entire substrate out of a substrate machining device, and placing the two halves of the substrate respectively on two layers of sucker assemblies of a substrate rotation apparatus at a second rotation position;
    controlling the substrate rotation apparatus to be switched to a first rotation position; and
    controlling the mechanical hand to take the two halves of the substrate sequentially out of the two layers of sucker assemblies of the substrate rotation apparatus at the first rotation position, and conveying the two halves of the substrate respectively into a substrate storage chuck.

5. The method for unloading the substrate according to claim 4, wherein controlling the mechanical hand to take the two halves of the substrate joined together into the entire substrate out of the substrate machining device, and placing the two halves of the substrate respectively on the two layers of sucker assemblies of the substrate rotation apparatus at the second rotation position comprises:
    when a plate body of an upper layer of sucker assembly of the substrate rotation apparatus comprises evasion notches for mechanical fingers to pass therethrough, controlling the mechanical hand to take the two halves of the substrate joined together into the entire substrate out of the substrate machining device;
    controlling the mechanical hand to place one half of the substrate on the upper layer of sucker assembly of the substrate rotation apparatus at the second rotation position;
    controlling the mechanical hand to descend to a lower layer of sucker assembly through the evasion notches; and
    controlling the mechanical hand to place the other half of the substrate on the lower layer of sucker assembly of the substrate rotation apparatus at the second rotation position.

6. The method for unloading the substrate according to claim 4, wherein before controlling the mechanical hand to take the two halves of the substrate sequentially out of the two layers of sucker assemblies of the substrate rotation apparatus at the first rotation position, the method further comprises:
    adjusting spacing between two adjacent mechanical fingers of the mechanical hand from a second preset spacing to a first preset spacing.

* * * * *